(12) United States Patent
Chikama

(10) Patent No.: US 7,670,656 B2
(45) Date of Patent: Mar. 2, 2010

(54) COMPOSITE SUBSTRATE AND METHOD FOR MANUFACTURE THEREOF

(75) Inventor: Yoshimasa Chikama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 66 days.

(21) Appl. No.: 11/911,555

(22) PCT Filed: May 1, 2006

(86) PCT No.: PCT/JP2006/309093

§ 371 (c)(1),
(2), (4) Date: Oct. 15, 2007

(87) PCT Pub. No.: WO2007/007458

PCT Pub. Date: Jan. 18, 2007

(65) Prior Publication Data

US 2009/0061182 A1    Mar. 5, 2009

(30) Foreign Application Priority Data

Jul. 7, 2005    (JP) .............................. 2005-199269

(51) Int. Cl.
*C09K 19/00*    (2006.01)

(52) U.S. Cl. ...................................................... 428/1.1
(58) Field of Classification Search ....................... None
See application file for complete search history.

(56) References Cited

U.S. PATENT DOCUMENTS

| 5,610,742 A | 3/1997 | Hinata et al. |
| 5,687,465 A | 11/1997 | Hinata et al. |
| 2007/0128376 A1* | 6/2007 | Harada et al. ................. 428/1.1 |
| 2009/0073443 A1* | 3/2009 | Shishido et al. .............. 356/369 |

FOREIGN PATENT DOCUMENTS

| JP | 09-148719 A | 6/1997 |
| JP | 2003-050382 A | 2/2003 |
| JP | 2003-236794 A | 8/2003 |
| JP | 2003-251731 A | 9/2003 |

OTHER PUBLICATIONS

Official communication issued in the International Application No. PCT/JP2006/309093, mailed on Aug. 15, 2006.

* cited by examiner

*Primary Examiner*—Arti Singh-Pandey
(74) *Attorney, Agent, or Firm*—Keating & Bennett, LLP

(57) ABSTRACT

A plastic substrate includes resin and glass fibers. In an end surface of the substrate, interfaces between the glass fibers and the resin are covered with a solidified melt of the glass fibers.

8 Claims, 4 Drawing Sheets

FIG. 3A
FIG. 3B
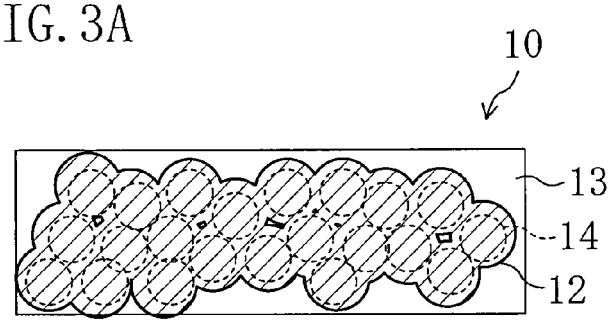
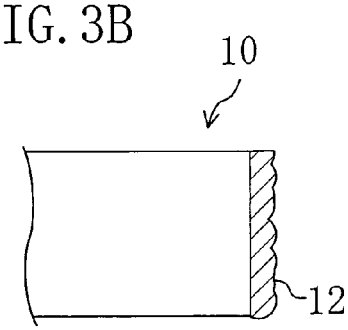
FIG. 4A
FIG. 4B
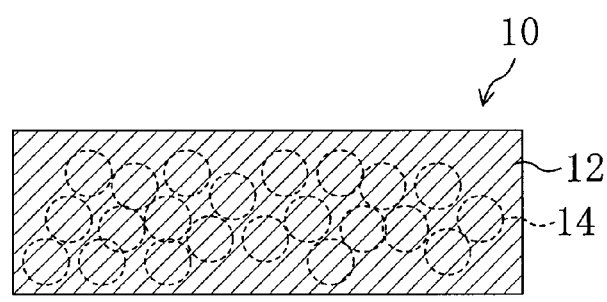
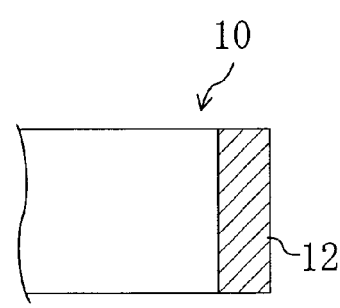
FIG. 5A
FIG. 5B
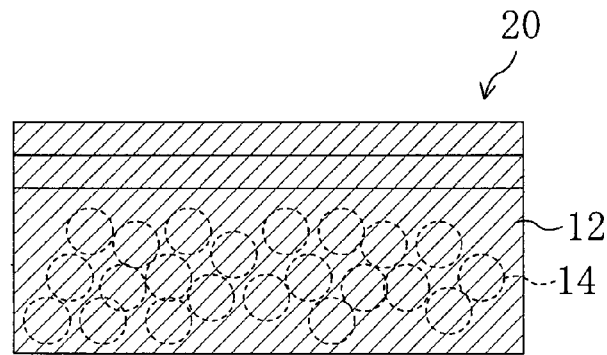
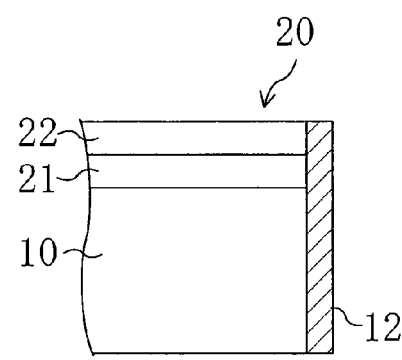

COMPOSITE SUBSTRATE AND METHOD FOR MANUFACTURE THEREOF

BACKGROUND OF THE INVENTION

1. Field of the Invention

The present invention relates to a composite substrate used for electronic devices such as display devices, and a method of manufacturing the same.

2. Description of the Related Art

In recent years, to meet the demand for reducing size and weight, a substrate for a liquid crystal panel is being switched from a glass substrate to a plastic substrate. Moreover, to increase a mechanical strength, a plastic substrate including glass fibers or glass beads may be used as a substrate for a liquid crystal panel.

Since the plastic substrate has a high permeability to gases such as oxygen or vapor and a high dimensional change rate due to water absorption, a display defect may occur due to bubbles formed by a permeating gas. If moisture enters a liquid crystal layer, the specific resistance of a liquid display material lowers, which may lead to a display defect. There is also such a problem that a dimensional change caused by moisture absorption during processes causes a poor connection due to a positional shift of transparent electrode circuits on an upper substrate and a lower substrate. In order to solve such problems, at least one surface of the plastic substrate is provided with an inorganic film or a layered film of an inorganic layer and an organic layer (for example, see Japanese Laid-Open Patent Publication No. 2003-251731).

However, an end surface of the plastic substrate is not provided with the inorganic layer or the like. Therefore, in the end surface of the plastic substrate, moisture or gas may enter through an interface between the plastic substrate and the inorganic layer or the like.

Japanese Laid-Open Patent Publication No. 2003-050382 discloses that a cut end surface of a plastic substrate is covered with a coating material by a dipping method or a dispenser method for sealing. However, the inventor found that the method of Japanese Laid-Open Patent Publication No. 2003-050382 has problems as follows. (1) Since the plastic substrate is thin, it is difficult to coat the end surface of the substrate with good adhesiveness. (2) The coating material easily flakes off, which leads to generation of dust. Since the plastic substrate is especially required to have flexibility, the adhesiveness of the coating material to the end surface of the substrate is important. (3) Since an end surface of a plastic substrate including glass fibers or glass beads has the glass fibers or the glass beads which are protruding, the end surface is extremely uneven. Therefore, it is difficult to coat the end surface with the good adhesiveness. Moreover, the difference in thickness of the coating material causes variations in hardening. As a result, flaking of the coating material more easily occurs.

A liquid crystal display device is typically formed by affixing an element substrate provided with elements such as TFTs (Thin Film Transistors) to a color filter (CF) substrate formed with color filters by a sealant and by sealing a liquid crystal material between the substrates. In order to increase the yield of liquid crystal panels, a big mother substrate including two substrates affixed to each other is cut into a plurality of liquid crystal panels. As a method of cutting the mother substrate, a dicing method or a stamping method (such as a Thomson method disclosed in Japanese Laid-Open Patent Publication No. 2003-236794) is generally adopted.

Cutting a plastic substrate including glass fibers or glass beads by the dicing method or the stamping method has problems as follows. (1) Since the glass fibers or the glass beads are bare in the end surface of the substrate, a slit is formed in interfaces between the plastic material and the glass fibers or the like due to a stress gap or the adhesiveness. The slit allows an easy entry of moisture or gas. (2) Since the substrate is mechanically cut, the glass fibers or glass beads fly off or the resin flakes off while the substrate is cut, which leads to generation of dust. (3) Since the glass fibers or the glass beads are bare in the end surface of the substrate and the adhesiveness between the glass fibers or glass beads and the resin in the end surface section is low, injuries or generation of dust may occur during processes after the cutting. (4) The substrate easily cracks due to the lowered adhesiveness or mechanical damages.

SUMMARY OF THE INVENTION

To solve the problems mentioned above, preferred embodiments of the present invention provide a technique to effectively suppress the permeation of moisture or gas through the end surface of the substrate.

A composite substrate according to a preferred embodiment of the present invention has an end surface of the substrate where an interface between at least two different materials constituting the substrate is covered with a solidified melt of one of the materials constituting the substrate. Specifically, the composite substrate according to a preferred embodiment of the present invention includes a first material and a second material differing in melting point from the first material, wherein in an end surface of the substrate, an interface between the first material and the second material is covered with a solidified melt of the first material or the second material.

The composite substrate according to a preferred embodiment of the present invention includes a plastic substrate including a glass material such as glass fibers, a glass cloth, or glass beads, a plastic substrate including a film or particles of metal or an alloy, a plastic substrate on at least one surface of which is stacked a coat layer, and a glass substrate on at least one surface of which is stacked a resin layer.

The composite substrate according to a preferred embodiment of the present invention can be used as an element substrate or a CF substrate of the display device. An example of the display device includes a liquid crystal display device, an inorganic or organic electroluminescent display device, a plasma display panel, a surface-conduction electron-emitter display, an electrochromic display device, or an electrophoretic display device. The composite substrate according to a preferred embodiment of the present invention is applicable not only to the display devices, but to also other electronic devices such as an X-ray sensor, or a solar cell.

According to various preferred embodiments of the present invention, it is possible to suppress the permeation of moisture or gas through the end surface of the substrate.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIG. 3A is a view illustrating an end surface of a plastic substrate cut by a laser beam, and FIG. 3B is a side view thereof.

FIG. 4A is a view illustrating an end surface of a plastic substrate cut by a method of a preferred embodiment of the present invention, and FIG. 4B is a side view thereof.

FIG. 5A is a view illustrating an end surface of a plastic substrate of a preferred embodiment of the present invention cut by a laser beam, and FIG. 5B is a side view thereof.

DETAILED DESCRIPTION OF PREFERRED EMBODIMENTS

With reference to the drawings, preferred embodiments of the present invention will be described below. In the following preferred embodiments, descriptions are given of a liquid crystal panel for displaying images (liquid crystal display panel) for example. Note that, the liquid crystal panel may be applicable for various purposes other than for displaying images. For example, the liquid crystal panel is applicable to an image shift panel in which pixels are sequentially shifted optically or a parallax barrier panel allowing three-dimensional picture display.

First, descriptions are given of the steps of manufacturing a liquid crystal display device from a substrate (hereinafter, referred to as a mother substrate) having a plurality of panel regions and including substrates affixed to each other. For every panel region of one substrate, TFTs arranged in a matrix, a plurality of source lines and a plurality of gate lines which cross each other, and pixel electrodes connected to the TFTs are formed, and then, alignment films are further formed followed by a rubbing process. The substrate thus formed is hereinafter referred to as a TFT substrate. For every panel region of the other substrate, common electrodes, color filters, and alignment films are formed, and then a rubbing process is performed. The substrate thus formed is hereinafter referred to as a CF substrate.

In a periphery of each panel region, a sealant is formed preferably in a substantially circular shape by screen printing. The sealant is provided with an opening which serves as an inlet for a liquid crystal material. On a surface of the electrode formed on one of the substrates, bead spacers are distributed, and then the two substrates are affixed to each other such that electrode surfaces of the two substrates face each other. In this way, the mother substrate is produced.

Figure 1:
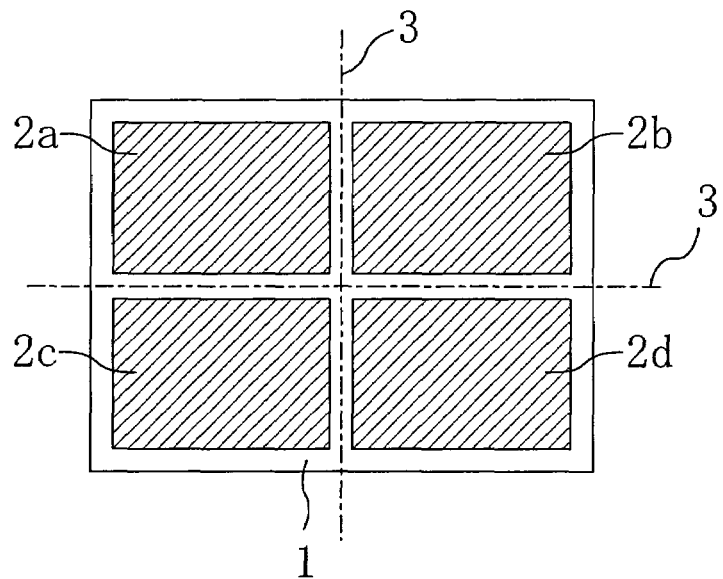
FIG. 1 is a plan view schematically illustrating a mother substrate.

FIG. 1 is a plan view schematically illustrating a mother substrate 1. The mother substrate 1 shown in FIG. 1 preferably has four panel regions 2a, 2b, 2c, and 2d, for example. The mother substrate 1 is cut along a cutting-plane line 3 shown in FIG. 1 to form four panels. From an inlet of each panel, a liquid crystal material is injected, and then the inlet is sealed to produce a liquid crystal panel. To the liquid crystal panel, a deflecting plate or a phase contrast plate is further affixed and various driver circuits are mounted for producing a liquid crystal display device. In the manufacturing steps mentioned above, the liquid crystal material is injected into a panel after the cutting. However, the liquid crystal material may be filled in the panel by a dropping and filling method before the cutting.

Next, descriptions are given of the step of cutting the mother substrate into the plurality of display panels. Note that, the TFT substrate and the CF substrate constituting the mother substrate correspond to a composite substrate in the preferred embodiments below.

A composite substrate of the present preferred embodiment preferably is a plastic substrate including a first material and a second material differing in melting point from the first material. The first material is resin for example. The second material is, for example, a high melting point material whose melting point is higher than that of the resin. An example of the resin includes thermoplastic resin or thermosetting resin. An example of the thermoplastic resin includes polyethylene, polypropylene, vinyl chloride, polystyrene, acrylic resin, polyethylene terephthalate, or polycarbonate. An example of the thermosetting resin includes epoxy resin, phenol resin, melamine resin, or silicon resin. An example of the high melting point material is glass, metal, or an alloy.

An example of the plastic substrate of the present preferred embodiment includes a plastic substrate formed of a woven or non-woven cloth of glass fibers impregnated with resin or a plastic substrate formed of resin in which glass fibers or glass beads are dispersed.

The proportion of the high melting point material in the resin is preferably, but not especially limited to, about 50% by volume or more. In the case of a plastic substrate in which glass fibers are dispersed and which has a thickness of greater than or equal to about 0.082 mm and smaller than or equal to about 0.122 mm, a glass fiber sheet (glass cloth) has a thickness of about 0.08 mm, and the proportion of the glass fibers in the resin is greater than or equal to about 70% by volume and smaller than or equal to about 95% by volume. In the case of a plastic substrate in which glass beads are dispersed, the proportion of the glass beads is greater than or equal to about 50% by volume and smaller than or equal to about 75% by volume.

Figure 2A:
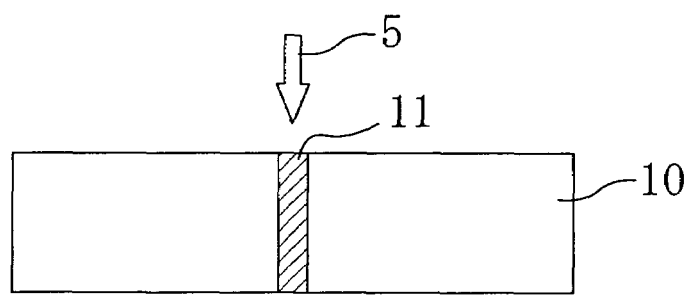
FIGS. 2A and 2B are views illustrating the steps of cutting a plastic substrate by a laser beam.
Figure 2B:
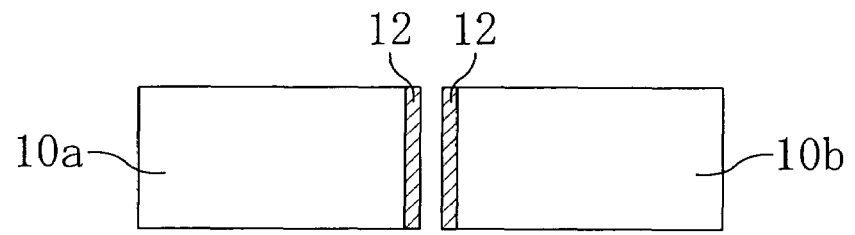

By way of example, descriptions are given of the steps of cutting by a laser beam the plastic substrate in which the glass fibers are dispersed. FIGS. 2A and 2B are views illustrating the steps of cutting the plastic substrate by a laser beam. As illustrated with FIG. 2A, a predetermined area (cutting-plane line) where the plastic substrate 10 is to be cut is irradiated with a laser beam 5. The used laser beam is typically a carbonic acid gas laser beam and has a wavelength of preferably longer than or equal to about 4.7 μm and shorter than or equal to about 12 μm. The present preferred embodiment preferably uses a laser beam having a wavelength of about 8.6 μm. In the area 11 irradiated with the laser beam 5, a resin component is molten or decomposed. The irradiation with the laser beam 5 is further continued to melt the glass fibers whose melting point is higher than that of the resin. As a result, the plastic substrate 10 is cut into two plastic substrates 10a and 10b as shown in FIG. 2B. Then the irradiation with the laser beam 5 is stopped, so that a melt, which is the glass fibers being molten, cools down and becomes a solidified melt 12.

FIG. 3A is a view illustrating an end surface of the plastic substrate 10 cut by the laser beam 5, and FIG. 3B is a side view thereof. As shown in FIG. 3A, in the end surface of the plastic substrate 10, the diameter of edges of glass fibers 14 expands, and interfaces between the glass fibers 14 and the resin 13 are sealed with the solidified melt 12 of the glass fibers 14. This makes it possible in the end surface of the plastic substrate 10, to prevent moisture or gas from permeating through the interfaces between the glass fibers 14 and the resin 13. Moreover, since the interfaces between the glass fibers 14 and the resin 13 are covered with the solidified melt 12, the adhesiveness between the glass fibers 14 and the resin 13 does not decrease, so that flaking of the resin 13 and the glass fibers 14 does not occur easily, allowing suppression of generation of dust. Since the edges of the glass fibers 14 are smoothed by melting and protrusions of the edges of the glass fibers 14 are no longer present in the end surface of the plastic substrate 10, it is possible to prevent injuries by the glass fibers 14 during processes after the cutting. In the present preferred embodiment, since the interfaces between the glass fibers 14 and the resin 13 are sealed with the melt-solidified product of the glass fibers 14, it is possible to greatly improve a barrier characteristic compared to coating with the resin.

In the present preferred embodiment, cutting by the laser beam 5 and coating with the solidified melt 12 are performed in the same step. Therefore, no steps or materials are added, and the crystal liquid panels are easily manufactured. Since a material constituting the plastic substrate 10 is molten and solidified, it is possible to perform coating with better adhesiveness compared to a method of, for example, deposition or application. Moreover, since heat is used for cutting, the impact is smaller than that in mechanical cutting. Therefore, the adhesiveness between the glass fibers 14 and the resin 13 does not lower. Therefore, the glass fibers 14 do not fly off easily, or the resin does not flake off easily while cutting the substrate, which makes it possible to suppress generation of dust.

In the present preferred embodiment, the descriptions have been given of the plastic substrate including resin and a high melting point material whose melting point is higher than that of the resin. However, the composite substrate of the present invention is not limited to this. For example, thermoplastic resin and a low melting point material (an inorganic material such as metal) whose melting point is lower than that of the thermoplastic resin may constitute a composite substrate.

In a first preferred embodiment, in order to seal the interfaces between the glass fibers 14 and the resin 13, the glass fibers are made molten by a laser beam such that the diameter of the edges of the glass fibers 14 protruding from the end surface of the plastic substrate 10 expands. However, the present invention is not limited to this. For example, it is also possible to set the laser beam to have a wider irradiation width to increase the amount of the glass fibers 14 which are to be made molten for forming a solidified melt 12 covering the end surface of the plastic substrate 10.

FIG. 4A is a view illustrating the end surface of the plastic substrate 10 cut by the method of the present preferred embodiment, and FIG. 4B is a side view thereof. As shown in FIG. 4A and FIG. 4B, the end surface of the plastic substrate 10 is covered with the solidified melt 12 of the glass fibers 14. In addition to the effect obtained in the first preferred embodiment, the present preferred embodiment can provide effects as follows.

Since the end surface of the plastic substrate 10 is covered with the solidified melt 12, it is difficult for moisture or gas to permeate through the interfaces between the glass fibers 14 and the resin 13, and also through the resin 13 itself. That is, it is possible to certainly prevent the permeation of moisture or gas through the end surface of the plastic substrate 10. Moreover, when the end surface of the plastic substrate 10 is covered with the melt-solidified product 12, flaking of the resin 13 or the glass fibers 14 does not occur easily, which makes it possible to certainly suppress generation of dust. Moreover, when the end surface of the plastic substrate 10 is covered with the solidified melt 12, it is possible to prevent the end surface of the substrate 10 from cracking. When the whole end surface of the plastic substrate 10 is covered with the solidified melt 12, the end surface having good smoothness is realized and protrusions of the glass fibers 14 are no longer found in the end surface. Therefore, it is possible to suppress the occurrence of injuries or generation of dust by the glass fibers 14 in processes after the cutting.

In the first preferred embodiment, the solidified melt 12 of the glass fibers 14 seals the interfaces between the glass fiber 14 and the resin 13. In the second preferred embodiment, the solidified melt 12 of the glass fibers 14 covers the end surface of the substrate 10. However, the present invention is not limited to these preferred embodiments. For example, the interfaces between the glass fibers 14 and the resin 13 may be sealed with a solidified melt of the resin 13, or the end surface of the substrate 10 may be covered with a solidified melt of the resin 13.

The plastic substrate may further have a coat layer on at least one surface of the plastic substrate. The coat layer includes an organic material and/or an inorganic material. An example of the organic material includes polyethylene vinyl alcohol copolymer, trifluoromonochloroethylene polymer, vinylidene chloride based polymer, polyacrylate resin, urethane resin, or epoxy resin. An example of the inorganic material includes metal such as Si, Zr, Al, Ta, or Sn, or oxide, nitride, or halogenide of such a metal. A coat layer compounded of an organic material and an inorganic material may be used. An example of the coat layer compounded of an organic material and an inorganic material includes a coat layer of an organic material in which an inorganic material is dispersed, an organic-inorganic nanocomposite, or an ultraviolet curing type silica precursor composite.

FIG. 5A is a view illustrating an end surface of a plastic substrate of the present preferred embodiment cut by a laser beam, and FIG. 5B is a side view thereof. A plastic substrate 20 of the present preferred embodiment includes a plastic base (corresponding to the plastic substrate of the first preferred embodiment) 10 and a first coat layer 21 and a second coat layer 22 stacked on the plastic base. In the present preferred embodiment, the first coat layer 21 includes an organic material, and the second coat layer 22 includes an inorganic material. If the plastic substrate 10 has a thickness of about 100 μm, each of the first coat layer 21 and the second coat layer 22 has a thickness of about several micrometers to about several tens of micrometers.

The plastic substrate 20 is cut by a carbonic acid gas laser beam, so that an end surface of the plastic substrate 20 is covered with the solidified melt 12 of the glass fibers 14 as shown in FIG. 5A and FIG. 5B. In addition to the effects obtained in the second preferred embodiment, the present embodiment can provide effects as follows.

In the end surface of the plastic substrate 20, an interface between the plastic base 10 and the first coat layer 21 and an interface between the first coat layer 21 and the second coat layer 22 are sealed with the solidified melt 12. Therefore, it is possible to suppress the permeation of moisture or gas through these interfaces. Since the first coat layer 21 and the second coat layer 22 are stacked on the plastic base 10, it is possible to suppress the permeation of moisture or gas through the surface of the plastic base 10. If the inorganic material included in the second coat layer 22 is a material which is made molten by a laser beam and then solidified, such as $SiO_2$, the inorganic material included in the second coat layer 22 as well as the glass fibers 14 are made molten by the irradiation of the laser beam and mixed with each other and solidified, which makes it possible to form a firm barrier having good adhesiveness on the end surface.

In the present preferred embodiment, two layers, i.e. the organic coat layer 21 and the inorganic coat layer 22 are stacked on the plastic base 10. However, only one of the two layers may be stacked on the plastic base 10.

The plastic substrate 20 of the third preferred embodiment has the first and second coat layers 21 and 22 stacked on the plastic base 10 including a high melting point material. In the present preferred embodiment, descriptions are given of a plastic substrate having the first and second coat layers 21 and 22 stacked on a plastic base including no high melting point material.

Figure 6:
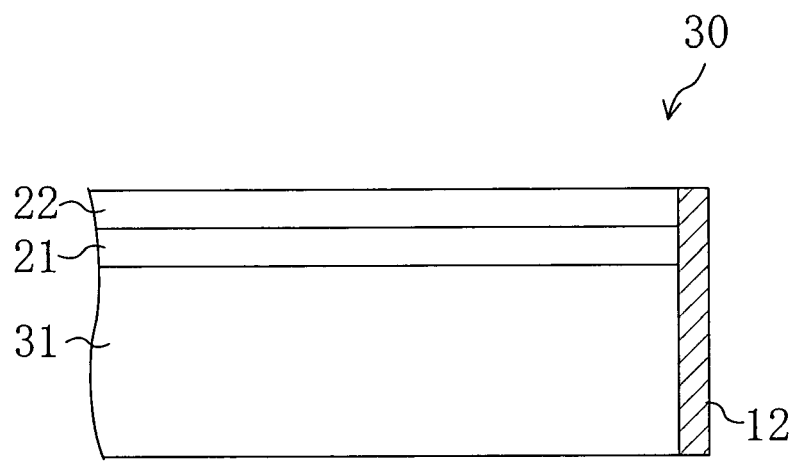
FIG. 6 is a side view of a plastic substrate of a preferred embodiment of the present invention cut by a laser beam.

FIG. 6 is a side view illustrating the plastic substrate of the present preferred embodiment cut by a laser beam. A plastic substrate 30 of the present preferred embodiment includes a plastic base 31 including no high melting point material such as glass or metal, the first coat layer 21 and the second coat layer 22 which are sequentially stacked on the plastic base 31. In the present preferred embodiment, at least one of the first coat layer 21 and the second coat layer 22 includes an inorganic material that can be made molten by a laser beam and then solidified.

In the present preferred embodiment, the inorganic material included in at least one of the first coat layer 21 and the second coat layer 22 melts and covers an end surface of the plastic substrate 30, and then solidifies for forming the solidified melt 12. Therefore, in the same manner as in the third preferred embodiment, the end surface of the plastic substrate 30 is provided with a barrier, which is the solidified melt 12.

Figure 7:
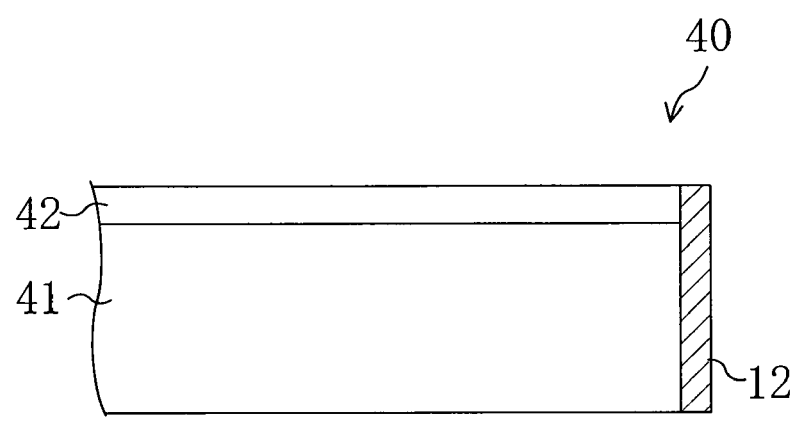
FIG. 7 is a side view of a glass substrate of a preferred embodiment of the present invention cut by a laser beam.

In the first through fourth preferred embodiments, a plastic substrate is shown as a composite substrate. In the present preferred embodiment, a glass substrate is shown as a composite substrate. FIG. 7 is a side view illustrating the glass substrate of the present preferred embodiment cut by a laser beam. A glass substrate 40 of the present preferred embodiment includes a glass base 41 and a resin layer 42 stacked on the glass base 41. Since the irradiation with a laser beam melts the glass base 41, an interface between the glass base 41 and the resin layer 42 in an end surface of the glass substrate 40 is sealed with the solidified melt 12.

The resin layer 42 includes thermoplastic resin or thermosetting resin and may further include an inorganic material such as metal or a metal oxide. Instead of the resin layer 42, the coat layer of third preferred embodiment may be stacked on the glass substrate 41.

Figure 8:
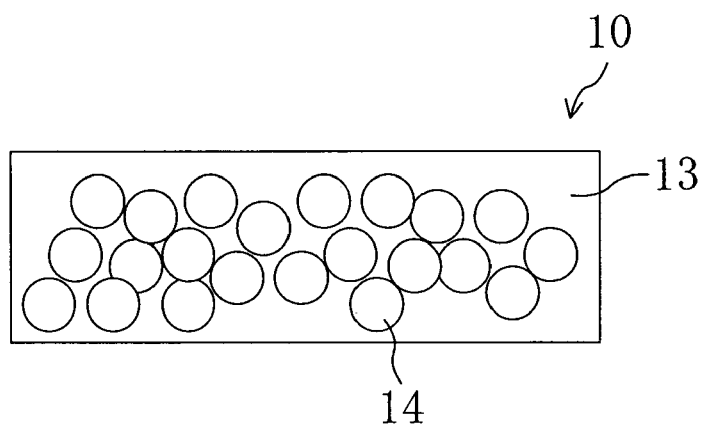
FIG. 8 is a view illustrating an end surface of a plastic substrate of a preferred embodiment of the present invention formed by a mechanical method.

Although a laser beam is preferably used for cutting in the first through fifth preferred embodiments, the present invention is not limited to this. For example, a mechanical method such as a dicing method or a stamping method may be used for cutting. FIG. 8 is a view illustrating an end surface of the plastic substrate 10 according to the first preferred embodiment cut by a mechanical method. Since interfaces between the glass fibers 14 and the resin 13 are bare in the end surface of the plastic substrate 10 as shown in FIG. 8, a thermal treatment is performed on the end surface by using, for example, a heater. The thermal treatment is performed at a temperature at which resin or a high melting point material (glass) melts. To melt the glass, the end surface is heated to a temperature of about 600° C. or higher. In the case where the thermal treatment is performed to melt resin, thermoplastic resin is preferably used.

The present preferred embodiment preferably uses the plastic substrate 10 including the glass fibers 14. However, it is also possible to use a plastic substrate on which a film of a high melting point material (such as metal or an alloy) other than glass is stacked, or a plastic substrate in which particles of a high melting point material (such as metal or an alloy) other than glass are dispersed. Note that, the same end surface coating as that by using the laser beam can be realized by using the heater.

In the first through sixth preferred embodiments, a material constituting the composite substrate is molten for sealing an interface between different kinds of materials or an end surface of a substrate. However, the present invention is not limited to this. Another material may be used in addition to or alternatively to the material constituting the composite substrate. In the present preferred embodiment, descriptions are given of a method for cutting the plastic substrate 10 of the first preferred embodiment by a laser beam and for covering an end surface of the plastic substrate 10 with the solidified melt 12.

Figure 9A:
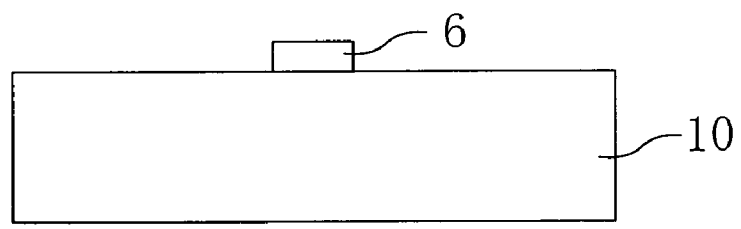
FIGS. 9A-9C are views illustrating the steps of cutting according to a preferred embodiment of the present invention.
Figure 9B:
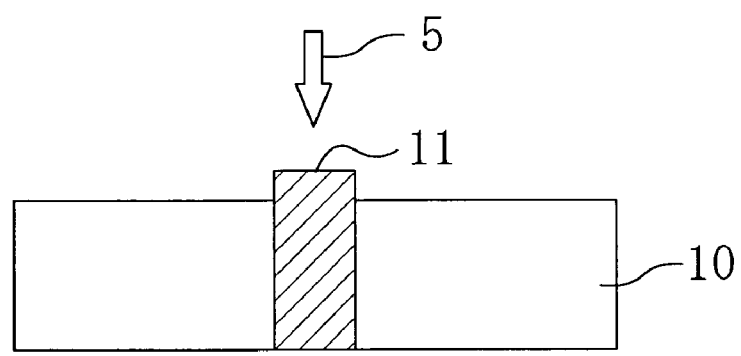
Figure 9C:
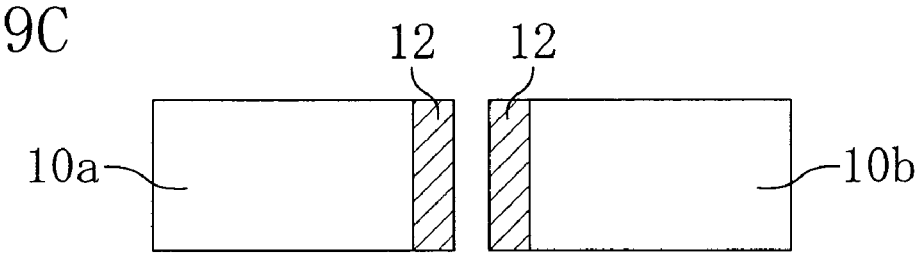

FIGS. 9A-9C are views illustrating cutting steps of the present preferred embodiment. As shown in FIG. 9A, a glass material 6 is put in a predetermined area where the plastic substrate 10 is to be cut. The width of the glass material 6 is preferably set to be shorter than or equal to that of the laser beam.

As shown in FIG. 9B, in the area 11 irradiated with the laser beam 5, the glass material 6 as well as glass fibers included in the plastic substrate 10 melts. The irradiation with the laser beam 5 is further continued to cut the plastic substrate 10 into two plastic substrates 10a and 10b as shown in FIG. 9C. Then, the irradiation with the laser beam 5 is stopped, so that a melt, which is the glass fibers being molten, cools down and becomes a solidified melt 12.

The present preferred embodiment preferably uses the plastic substrate 10 including a high melting point material (glass fibers). However, it is also possible to use a plastic substrate including no high melting point material. For example, a glass material is put on the plastic substrate including no high melting point material, and the glass material is made molten by a laser beam for covering the end surface of the plastic substrate by the solidified melt.

Although the present invention has been described with reference to the preferred embodiments thereof, the technical scope of the present invention is not limited to that described in the above preferred embodiments. It should be understood by those skilled in the art that the above preferred embodiments are exemplary only, and that various modifications may be further made to combinations of the foregoing components and processes and such modifications are also intended to fall within the technical scope of the present invention. For example, in the preferred embodiments above, a crystal liquid display device of active matrix type using TFTs has been described as an example. However, the present invention is also applicable to a display device of active matrix type in which a two-terminal element such as MIM (Metal Insulator Metal) is used as a switching element, or a display device of passive (multiplex) drive type. The present invention is also applicable to a transmission-type, a reflection-type, or a transmission- and reflection-type display device.

As described above, the present invention is applicable to a composite substrate used for electronic devices such as a display device and to a method of manufacturing the same.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A composite substrate comprising:
   a first material; and a second material differing in melting point from the first material; wherein in an end surface of the substrate, an interface between the first material and the second material is covered with a solidified melt of the first material or the second material.

2. The composite substrate of claim 1, wherein the first material is resin and the second material is glass, and an interface between the resin and the glass in the end surface of the substrate is covered with a solidified melt of the glass.

3. The composite substrate of claim 1, wherein the first material is resin and the second material is glass, and the end surface of the substrate is covered with a solidified melt of the glass.

4. The composite substrate of claim 1, wherein the first material is thermoplastic resin, and in the end surface of the substrate, an interface between the thermoplastic resin and the second material is covered with a solidified melt of the thermoplastic resin.

5. The composite substrate of claim 1, wherein the composite substrate has a layered structure of a first material layer including the first material and a second material layer including the second material, and in the end surface of the substrate, an interface between the first material layer and the second material layer is covered with a solidified melt of the first material or the second material.

6. The composite substrate of claim 1, further comprising a coat layer on at least one surface of the composite substrate.

7. A display device comprising the composite substrate of claim 1.

8. A method of manufacturing a composite substrate, comprising the steps of:

preparing a mother composite substrate including a first material and a second material differing in melting point from the first material; and irradiating with a laser beam a predetermined area where the mother composite substrate is to be cut to heat the predetermined area to a temperature higher than or equal to a higher one of melting points of the first material and the second material for cutting the mother composite substrate in the predetermined area.

* * * * *